United States Patent

Blalock et al.

[11] Patent Number: 6,136,670
[45] Date of Patent: Oct. 24, 2000

[54] SEMICONDUCTOR PROCESSING METHODS OF FORMING CONTACTS BETWEEN ELECTRICALLY CONDUCTIVE MATERIALS

[75] Inventors: Guy T. Blalock; Max Hineman, both of Boise, Id.

[73] Assignee: Micron Technology, Inc., Boise, Id.

[21] Appl. No.: 09/146,763

[22] Filed: Sep. 3, 1998

[51] Int. Cl.[7] .......................... H01L 21/322; H01L 21/44; H01L 21/461

[52] U.S. Cl. ........................ 438/471; 438/58; 438/143; 438/402; 438/648; 438/685; 438/688; 438/722; 438/723

[58] Field of Search ....................................... 438/688, 685, 438/648, 722, 58, 710, 143, 723, 402, 471, FOR 144

[56] References Cited

U.S. PATENT DOCUMENTS

| | | | |
|---|---|---|---|
| 5,480,836 | 1/1996 | Harada et al. | 437/192 |
| 5,498,768 | 3/1996 | Nishitani et al. | 437/192 |
| 5,527,739 | 6/1996 | Parrillo et al. | 437/198 |
| 5,726,097 | 3/1998 | Yanagida | 438/622 |
| 5,801,098 | 9/1998 | Fiordalice et al. | 438/653 |

OTHER PUBLICATIONS

John F. O'Hanlon, Ch. 14 *Getter and Ion Pumps, in* A User's Guide to Vacuum Technology, at 236–245 (John Wiley & Sons, 2d ed. 1989).

*Primary Examiner*—John F. Niebling
*Assistant Examiner*—Ha Tran Nguyen
*Attorney, Agent, or Firm*—Wells, St. John, Roberts, Gregory & Matkin P.S.

[57] ABSTRACT

In one aspect, the invention includes a semiconductor processing method of forming a contact between two electrically conductive materials comprising: a) forming a first conductive material over a substrate, the first conductive material being capable of being oxidized in the presence of oxygen to an insulating material; b) sputter cleaning the first conductive material in the presence of oxygen in a gaseous phase and in the presence of an oxygen gettering agent; and c) forming a second conductive material in electrical contact with the first conductive material. In another aspect, the invention includes a semiconductor processing method of forming a contact between two metal layers comprising: a) forming a first metal layer over a substrate; b) forming an oxygen containing material over the substrate proximate the first metal layer and covering at least a portion of the first metal layer; c) forming an opening through the oxygen containing material to the first metal layer; e) after forming the opening and with the substrate in a processing chamber, sputter cleaning the first metal layer and liberating oxygen from the oxygen containing material; f) while sputter cleaning, gettering the liberated oxygen within the processing chamber; and g) forming a second metal layer within the opening and in electrical contact with the first metal layer.

37 Claims, 2 Drawing Sheets

6,136,670

SEMICONDUCTOR PROCESSING METHODS OF FORMING CONTACTS BETWEEN ELECTRICALLY CONDUCTIVE MATERIALS

TECHNICAL FIELD

The invention pertains to semiconductor processing methods of forming contacts between electrically conductive materials, and particularly pertains to methods of forming contact between two metal layers.

BACKGROUND OF THE INVENTION

It is frequently desirable to form an electrically conductive contact between two conductive materials, such as, for example, two metal layers during semiconductor processing. Metal layer to metal layer contacts can be used for interconnecting electrical components of an integrated circuit. Ideally, metal layer to metal layer electrical connections will comprise direct physical contact of one metal layer to another metal layer. The following invention encompasses methods of forming electrical connection between one conductive layer and another.

SUMMARY OF THE INVENTION

In one aspect, the invention encompasses a semiconductor processing method of forming a contact between two electrically conductive materials. A first conductive material is formed over a substrate. The first conductive material is capable of being oxidized in the presence of oxygen to an insulating material. The first conductive material is sputter cleaned in the presence of oxygen in a gaseous phase, and in the presence of an oxygen gettering agent. A second conductive material is formed in electrical contact with the first conductive material.

In another aspect, the invention encompasses a semiconductor processing method of forming a contact between two metal layers. A first metal layer is formed over a substrate. An oxygen containing material is formed over the substrate proximate the first metal layer. The oxygen containing material covers at least a portion of the first metal layer. An opening is formed through the oxygen containing material to the first metal layer. After forming the opening, the first metal layer is sputter cleaned in a processing chamber. During the sputter cleaning, oxygen is liberated from the oxygen containing material. The liberated oxygen is gettered within the processing chamber. A second metal layer is formed within the opening and in electrical contact with the first metal layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
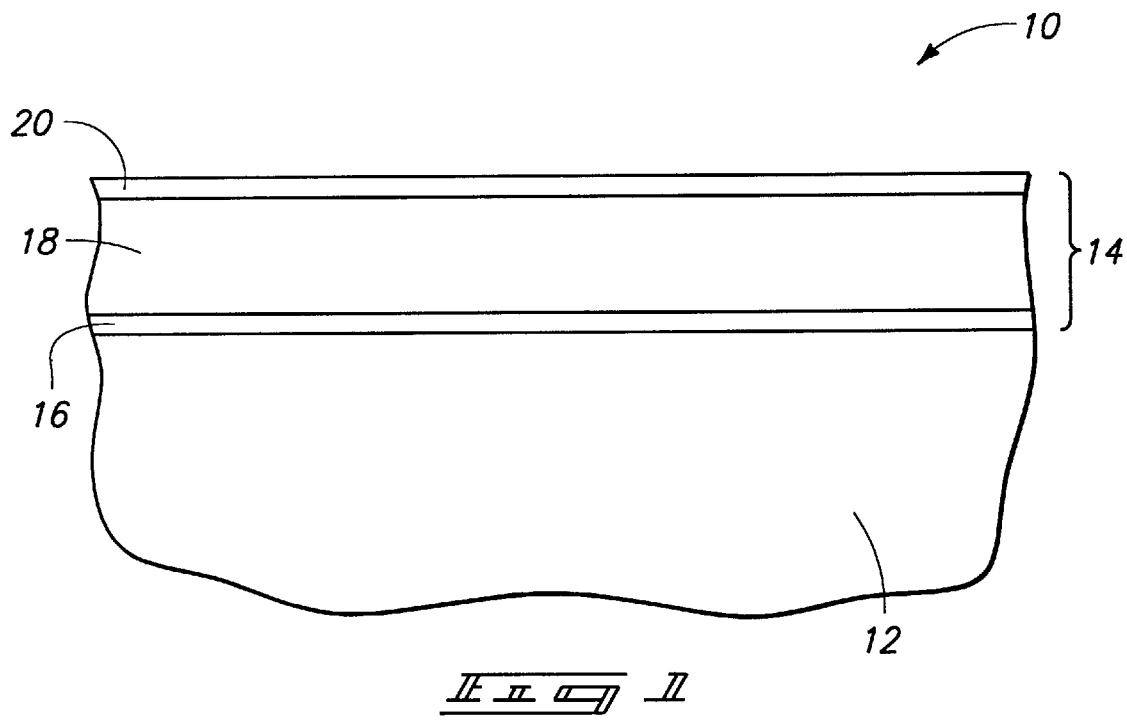
FIG. 1 is a diagrammatic, cross-sectional view of a semiconductor wafer fragment being processed according to a method of the present invention.

A method of the present invention is described with reference to FIGS. 1–4. Referring first to FIG. 1, a semiconductor wafer fragment 10 is shown at a preliminary step of a processing method of the present invention. Wafer fragment 10 comprises a substrate 12 and a first metal layer 14 formed over substrate 12. Substrate 12 can comprise, for example, a monocrystalline silicon wafer. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

First metal layer 14 is a composite of a first titanium-comprising layer 16, an aluminum-comprising layer 18, and a second titanium-comprising layer 20. Example materials for first and second titanium-comprising layers 16 and 20 are titanium or titanium nitride, or combinations of titanium and titanium nitride. Example materials for aluminum-comprising layer 18 are aluminum or an aluminum alloy layer, or a combination of aluminum and an aluminum alloy. An example aluminum alloy comprises aluminum and copper. Methods for forming metal layer 14 are known to persons of ordinary skill in the art, and can comprise, for example, chemical vapor deposition of titanium nitride, followed by chemical vapor deposition of aluminum, followed by chemical vapor deposition of titanium nitride. Other deposition techniques are also, of course, contemplated.

Figure 2:
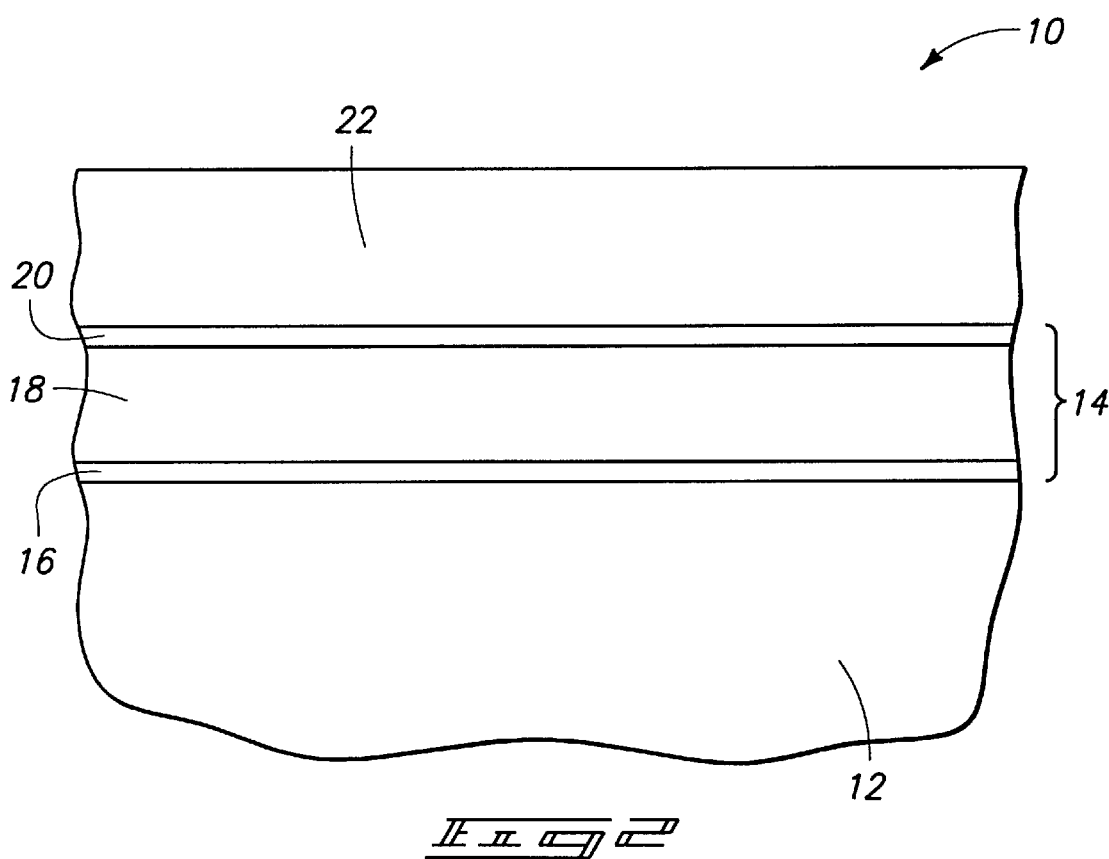
FIG. 2 is a view of the FIG. 1 wafer fragment at a processing step subsequent to that of FIG. 1.

Referring to FIG. 2, an insulative layer 22 is formed over metal layer 14. Insulative layer 22 can comprise, for example, silicon dioxide ($SiO_2$). Methods of forming $SiO_2$ layer 22 are known to persons of ordinary skill in the art and can include, for example, chemical vapor deposition.

Figure 3:
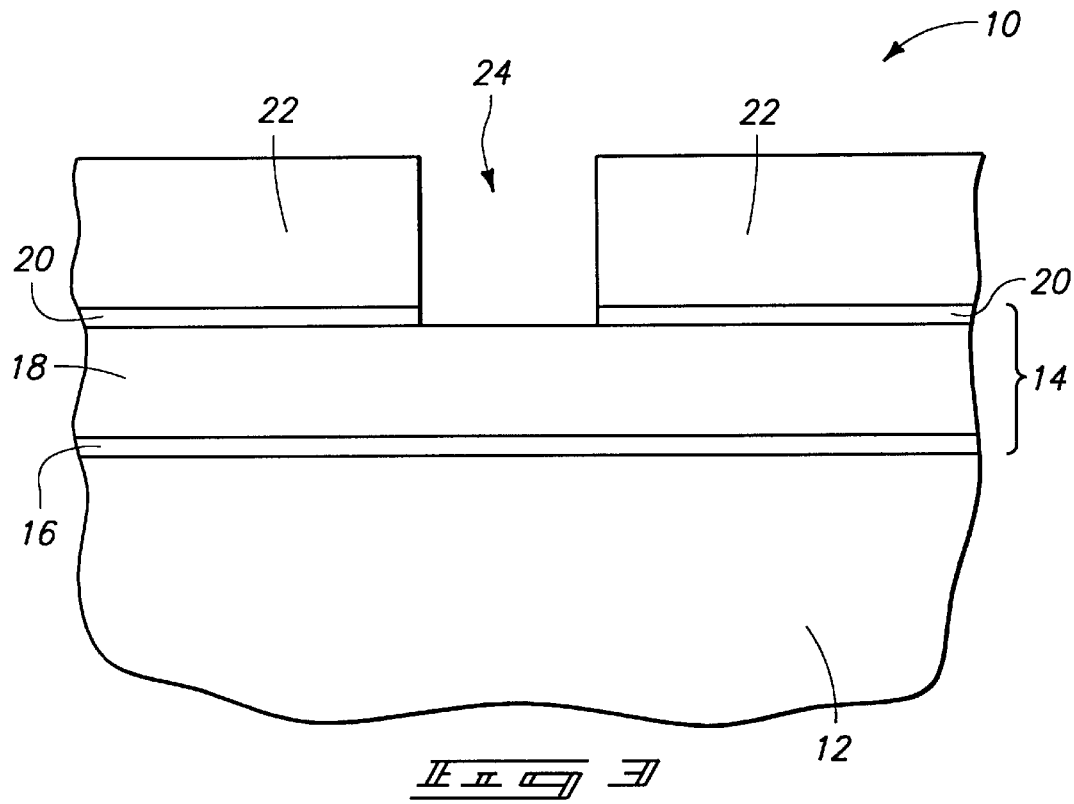
FIG. 3 is a view of the FIG. 1 wafer fragment at a processing step subsequent to that of FIG. 2.

Referring to FIG. 3, a contact opening 24 is etched through $SiO_2$ layer 22 to metal layer 14. Contact opening 24 preferably extends through titanium-comprising layer 20 to expose aluminum-comprising layer 18. Methods of forming contact opening 24 are known to persons of ordinary skill in the art. An example method is to provide a patterned masking layer (not shown) over $SiO_2$ layer 22. Such patterned masking layer can comprise, for example, photoresist. The pattern in the masking layer leaves an unmasked portion at a desired location over what will be contact opening 24. Unmasked portions of $SiO_2$ layer 22 and titanium layer 20 are removed, for example, using a Reactive Ion Etch (RIE) employing a fluorocarbon-based chemistry to form an opening 24. Wet and dry chemical cleaning remove byproducts deposited by the RIE process, as is known in the art. After the formation of opening 24, the masking layer can be removed. For example, if the masking layer comprises photoresist, it can be removed by ashing the photoresist.

Preferably, formation of opening 24 and removal of the patterned masking layer, substrate 10 is transferred to a processing chamber for precleaning of the aluminum film using an ion sputter etch. Such precleaning is performed to further clean the aluminum upper film surface. It is preferred that the substrate be kept at a constant or low vacuum condition between the ion sputter etch chamber and the second metal film deposition chamber. This is commonly achieved using clustered systems known to the art.

The sputter etching can, in addition to cleaning the aluminum upper film surface, sputter etch the $SiO_2$ layer 22.

For instance, the sputter etching can comprise physical bombardment of SiO$_2$ layer 22 with a gas that is non-reactive with SiO$_2$, such as, for example, Ar, Kr or Xe.

In accordance with the present invention, it is recognized that SiO$_2$ layer 22 is an oxygen-containing layer, and that sputter etching of SiO$_2$ layer 22 can liberate oxygen into a processing chamber within which the etching occurs. The liberated oxygen is particularly likely to be in a gas phase. The liberated oxygen can undesirably react with exposed aluminum in opening 24 to form aluminum oxide. Such conversion of an exposed portion of aluminum-comprising layer 18 to aluminum oxide effectively converts the exposed portion from a conductive material to an insulating material. Such a layer of aluminum oxide can detrimentally decrease conductance between aluminum layer 18 and a conductive material subsequently deposited in opening 24. Oxidation of aluminum in opening 24 generally most severely degrades performance of vias having an aspect ratio of greater than 0.5. As high aspect ratios are common in highly integrated devices, such as Very Large Scale Integrated (VLSI) devices, and Ultra Large Scale Integrated (ULSI) devices, oxidation of aluminum is particularly problematic in such devices.

The sputter cleaning of aluminum-comprising layer 18 occurs in a processing chamber. In accordance with the present invention, an oxygen gettering material is provided within the processing chamber to getter oxygen liberated from SiO$_2$ layer 22. The gettering material can comprise a number of materials, including solid phase materials and gas phase materials. Example gas phase gettering materials are gases selected from the group consisting of H$_2$, CO, NH$_3$, CH$_4$ and mixtures thereof. Example solid phase gettering materials include molybdenum, niobium, tantalum, zirconium, aluminum, and titanium. Where such solid phase gettering materials are employed for oxygen gettering, the specific gettering material selected as the gettering agent is provided to the processing chamber while sputter cleaning the first metal layer within such chamber.

When gas phase gettering is utilized, the gettering gas is preferably provided to an amount that is less than or equal to 50 volume percent of the total gas provided in the processing chamber. More preferably, if the gas is H$_2$, it will be provided to an amount that is less than or equal to 4 volume percent of the total gas provided in the processing chamber, and if the gas is CO or CH$_4$ it will be provided to an amount that is less than or equal to 3 volume percent of the total gas provided in the processing chamber. The gettering gases react with liberated oxygen to incorporate the oxygen into various molecules. For instance, H$_2$ can react with liberated oxygen to form H$_2$O, and CO can react with liberated oxygen to form CO$_2$. Thus an environment is created whereby the liberated oxygen, regardless of form, has a greater affinity for something other than the exposed aluminum.

An example utilization of H$_2$ as a gettering agent is as follows. An Applied Materials High Density Endura PVD sputtering system is used to clean the aluminum surface at the bottom of opening 24. An argon gas flow rate through the system is adjusted to 48 sccm (standard cubic centimeters/minute), and a hydrogen gas flow rate through the system is adjusted to 2 sccm. Pressure within the processing chamber is maintained at about 1.5 mTorr, and a wafer temperature within the chamber is maintained at about 50° C. The power in the system is maintained at 500 watts for the source, with a 250 watt bias being applied to a wafer during processing.

Figure 4:
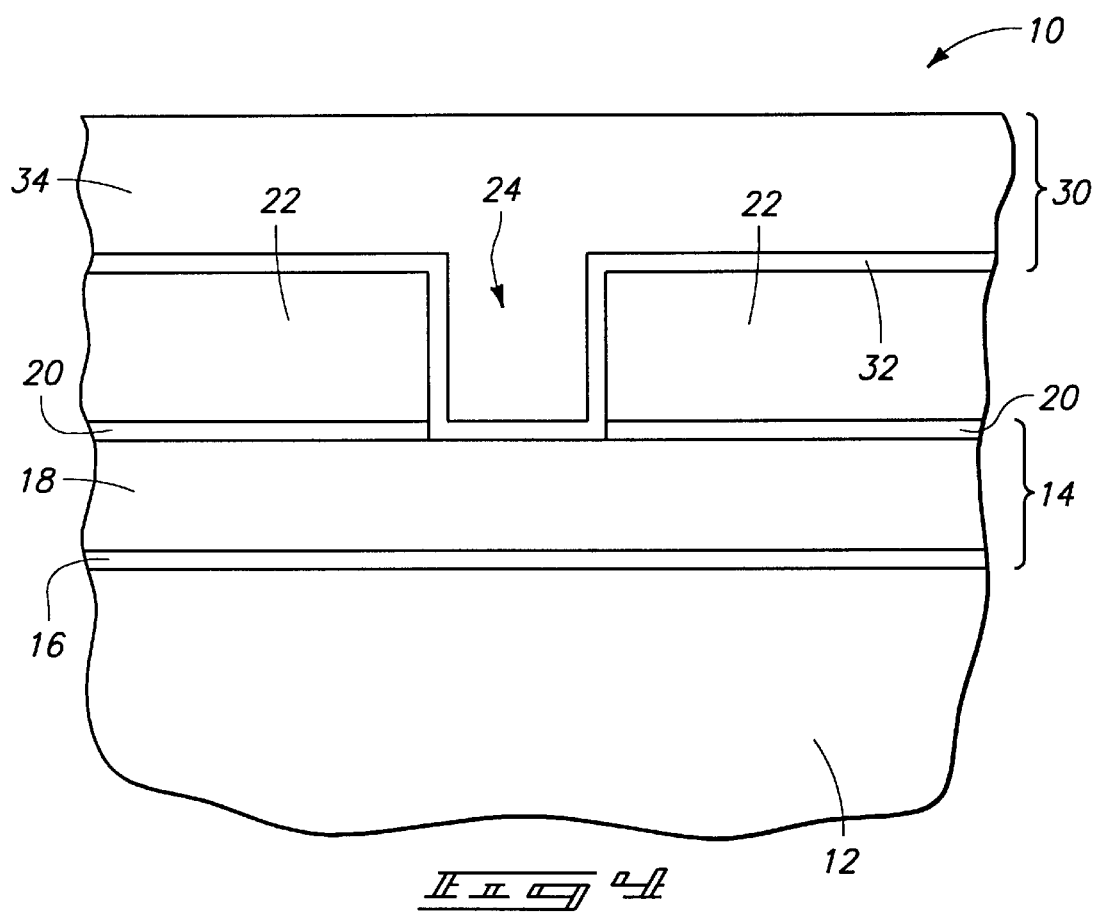
FIG. 4 is a view of the FIG. 1 wafer fragment at a processing step subsequent to that of FIG. 3.

FIG. 4 shows subsequent wafer processing after opening 24 is cleaned. A second metal layer 30 is provided over SiO$_2$ material 22, and within opening 24 to contact first metal layer 14. Second metal layer 30 comprises an elemental titanium layer 32 underlying an aluminum-comprising layer 34. Aluminum-comprising layer 34 can comprise, for example, aluminum, aluminum alloys, or combinations of aluminum and aluminum alloys. A frequently utilized aluminum alloy is an aluminum-copper alloy. Methods for forming layers 32 and 34 are known to persons of ordinary skill in the art.

Utilization of an oxygen gettering agent during cleaning of contact opening 24 can prevent formation of Al$_2$O$_3$ or at least reduce its thickness if formed. Accordingly, titanium layer 32 can form a better electrical contact to aluminum layer 14 than is obtainable with prior art processes which do not utilize oxygen gettering materials during formation of a contact opening through oxygen-comprising material 22.

The deposition of metal layers 14 and 30 preferably occurs in processing chambers different from the processing chamber utilized for sputter etching of metal layer 14.

Although the invention has been described with reference to an application in which two metal layers are connected, persons of ordinary skill in the art will recognize that the invention pertains to any application in which oxygen is present, or liberated, during etching of an oxidizable material. Accordingly, the invention is not to be limited to methods of connecting metal layers, but is instead to be limited only in accordance with the claims that follow, properly interpreted in accordance with the doctrine of equivalents. An example application in which an oxidizable material other than a metal is etched is an application in which silicon is etched.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

forming an oxidizable material over a substrate;

covering at least a portion of the oxidizable material with an oxygen-containing layer;

forming a contact opening in the oxygen-containing layer; and exposing the substrate to sputter etching conditions, the sputter etching conditions releasing oxygen from the oxygen-containing layer, the sputter etching occurring in the presence of an oxygen gettering agent which getters the released oxygen and inhibits the released oxygen from oxidizing the oxidizable material.

2. The method of claim 1 wherein the oxidizable material comprises a metal.

3. The method of claim 1 wherein the oxidizable material comprises silicon.

4. A semiconductor processing method of forming a contact between two electrically conductive materials comprising:

forming a first conductive material over a substrate;

covering at least a portion of the first conductive material with an oxygen-containing layer;

forming a contact hole in the oxygen-containing layer;

treating the first conductive material with a sputter etch, the sputter etch releasing oxygen from the oxygen-containing layer, the treating occurring in the presence of an oxygen gettering agent which getters the released oxygen and inhibits the released oxygen from oxidizing the first conductive material; and forming a second conductive material within the opening and in electrical contact with the first conductive material.

5. The method of claim 4 wherein the gettering agent is a solid.

6. The method of claim 4 wherein the gettering agent is a gas.

7. A semiconductor processing method of forming a contact between two metal layers comprising:

forming a first metal layer over a substrate;

covering at least a portion of the first metal layer with a material;

forming an opening through the material to the first metal layer;

sputter cleaning the first metal layer in the presence of oxygen in a gaseous phase and in the presence of an oxygen gettering agent which inhibits an oxidation of the first metal layer; and forming a second metal layer within the opening and in electrical contact with the first metal layer.

8. The method of claim 7 wherein the first metal layer comprises a same metal as the second metal layer.

9. The method of claim 7 wherein the first metal layer comprises a different metal than the second metal layer.

10. The method of claim 7 wherein the material comprises an insulative material.

11. The method of claim 7 wherein the gettering agent is in a gas phase.

12. The method of claim 7 wherein the gettering agent is in a solid phase.

13. A semiconductor processing method of forming a contact between two metal layers comprising:

forming a first metal layer over a substrate;

forming an oxygen containing material over the substrate proximate the first metal layer and covering at least a portion of the first metal layer;

forming an opening through the oxygen containing material to the first metal layer;

after forming the opening, providing the substrate in a processing chamber;

with the substrate in the processing chamber, sputter cleaning the first metal layer and liberating oxygen from the oxygen containing material;

while sputter cleaning, gettering substantially the liberated oxygen within the processing chamber; and forming a second metal layer within the opening and in electrical contact with the first metal layer.

14. The method of claim 13 wherein the oxygen comprising material comprises $SiO_2$.

15. The method of claim 13 wherein the oxygen comprising material comprises $SiO_2$ and the first metal layer comprises an outer surface of TiN over a conductive material, the method further comprising:

etching through the TiN to the conductive material.

16. The method of claim 15 wherein the first metal layer comprises aluminum.

17. The method of claim 13 wherein the first metal layer comprises aluminum and the oxygen comprising material comprises $SiO_2$.

18. The method of claim 13 wherein the first metal layer comprises aluminum, the second metal layer comprises titanium, and the oxygen comprising material comprises $SiO_2$.

19. The method of claim 13 wherein the gettering comprises gas phase gettering.

20. The method of claim 13 wherein the gettering comprises gas phase gettering with a gas comprising hydrogen.

21. The method of claim 13 wherein the gettering comprises gas phase gettering with a gas selected from the group consisting of $H_2$, CO, $NH_3$, $CH_4$, and mixtures thereof.

22. The method of claim 13 wherein the gettering comprises gas phase gettering with $H_2$, and wherein the $H_2$ is provided to an amount that is less than or equal to 50 volume percent of a total volume of gas provided in the processing chamber.

23. The method of claim 13 wherein the gettering comprises gas phase gettering with $H_2$, and wherein the $H_2$ is provided to an amount that is less than or equal to 4 volume percent of a total volume of gas provided in the processing chamber.

24. The method of claim 13 wherein the gettering comprises gas phase gettering with CO, and wherein the CO is provided to an amount that is less than or equal to 3 volume percent of a total volume of gas provided in the processing chamber.

25. The method of claim 13 wherein the gettering comprises gas phase gettering with $CH_4$, and wherein the $CH_4$ is provided to an amount that is less than or equal to 3 volume percent of a total volume of gas provided in the processing chamber.

26. The method of claim 13 wherein the gettering comprises solid phase gettering.

27. The method of claim 13 wherein the gettering comprises solid phase gettering with a gettering material comprising molybdenum, niobium, tantalum, zirconium, aluminum, or titanium.

28. A semiconductor processing method of forming a contact between two metal layers comprising:

forming a first metal layer over a substrate, the first metal layer comprising multiple layers formed by:
    forming a first titanium-comprising layer over a substrate;
    forming a conductive material layer over the first titanium-comprising layer; and
    forming a second titanium-comprising layer over the conductive material layer;

forming an insulative material over at least a portion of the first metal layer;

forming an opening through the insulative material to the first metal layer;

after forming the opening, providing the first metal layer and the insulative material in a processing chamber and sputter cleaning the first metal layer;

while sputter cleaning the first metal layer, gettering substantially oxygen within the processing chamber; and forming a second metal layer within the opening and in electrical contact with the first metal layer.

29. The method of claim 28 wherein the forming the opening comprises forming the opening through the second titanium-comprising layer and to the conductive material layer.

30. The method of claim 28 wherein the first and second titanium-comprising layers comprise TiN.

31. The method of claim 28 wherein the conductive material layer comprises aluminum.

32. The method of claim 28 wherein the second metal layer comprises titanium and aluminum.

33. The method of claim 28 wherein the conductive material layer comprises aluminum and the second metal layer comprises titanium.

34. The method of claim 28 wherein the insulative material comprises $SiO_2$.

35. The method of claim 28 wherein the gettering comprises gas phase gettering.

36. The method of claim 28 wherein the gettering comprises gas phase gettering with a gas comprising hydrogen.

37. The method of claim 28 wherein the gettering comprises solid phase gettering.

* * * * *

UNITED STATES PATENT AND TRADEMARK OFFICE
CERTIFICATE OF CORRECTION

PATENT NO : 6,136,670

DATED : October 24, 2000

INVENTOR(S) : Guy T. Blalock and Max F. Hineman

It is certified that error appears in the above-identified patent and that said Letters Patent are hereby corrected as shown below:

Col. 6, lines 57 and 58
replace "gettering substantially"
with --substantially gettering--.

Signed and Sealed this

First Day of May, 2001

Attest:

NICHOLAS P. GODICI

Attesting Officer    Acting Director of the United States Patent and Trademark Office